(12) United States Patent
Gauthier et al.

(10) Patent No.: US 6,573,770 B1
(45) Date of Patent: Jun. 3, 2003

(54) PROGRAMMABLE LEAKAGE CURRENT OFFSET FOR DELAY LOCKED LOOP

(75) Inventors: Claude R. Gauthier, Fremont, CA (US); Pradeep R. Trivedi, Sunnyvale, CA (US); Brian W. Amick, Austin, TX (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/230,726

(22) Filed: Aug. 29, 2002

(51) Int. Cl.⁷ .................................................. H03L 7/06
(52) U.S. Cl. ...................................... 327/156; 327/157
(58) Field of Search ................................. 327/156–159; 375/376

(56) References Cited

U.S. PATENT DOCUMENTS 6,147,530 A * 11/2000 Nogawa ..................... 327/156
6,420,914 B1 * 7/2002 Hasegawa ................... 327/112
6,424,191 B1 * 7/2002 Nayebi et al. .............. 327/156
6,473,485 B1 * 10/2002 Fernandez-Texon ......... 377/27

* cited by examiner

*Primary Examiner*—Kenneth B. Wells
(74) *Attorney, Agent, or Firm*—Rosenthal & Osha L.L.P.

(57) ABSTRACT

A method and apparatus for post-fabrication adjustment of a delay locked loop leakage current is provided. The adjustment system includes an adjustment circuit that adjusts a leakage current offset circuit to compensate for the leakage current of a capacitor in the delay locked loop. The capacitor connects to a control voltage of the delay locked loop. Such control of the leakage current in the delay locked loop allows a designer to achieve a desired delay locked loop operating characteristic after the delay locked loop has been fabricated.

25 Claims, 7 Drawing Sheets

PROGRAMMABLE LEAKAGE CURRENT OFFSET FOR DELAY LOCKED LOOP

BACKGROUND OF INVENTION

As the frequencies of modern computers continue to increase, the need to rapidly transmit data between chip interfaces also increases. To accurately receive data, a clock signal is often sent to help recover the data. The clock signal determines when the data should be sampled or latched by a receiver circuit.

The clock signal may transition at the beginning of the time the data is valid. The receiver circuit, however, may require that the clock signal transition during the middle of the time the data is valid. Also, the transmission of the clock signal may degrade as it travels from its transmission point. In both circumstances, a delay locked loop, or "DLL," may be used to regenerate a copy of the clock signal at a fixed phase shift with respect to the original clock signal.

FIG. 1 shows a section of a typical computer system component (100). Data (14) that is K bits wide is transmitted from circuit A (12) to circuit B (34) (also referred to as the "receiver circuit"). To aid in the recovery of the transmitted data, a clock signal (16) is also transmitted with the data (14). The circuits (12, 34) could also have a path to transmit data from circuit B (34) to circuit A (12) along with an additional clock signal (not shown). The clock signal (16) may transition from one state to another at the beginning of data transmission. Circuit B (34) requires a clock signal temporally located some time after the beginning of the valid data. Furthermore, the clock signal (16) may have degraded during transmission. The DLL has the ability to regenerate the clock signal (16) to a valid state and to create a phase shifted version of the clock signal (16) to be used by other circuits. For example, the receiver circuit (34) may use the phase shifted version of the clock signal (16) as the receiver circuit's sampling signal. The receiver circuit's sampling signal determines when the input to the receiver circuit should be sampled. The performance of a DLL is critical and must maintain a proper reference of time on the CPU, or generically, an integrated circuit.

FIG. 2 shows a block diagram of a typical DLL (200). Clock signal (201) is input to the DLL (200) to create a phased (i.e., delayed) output. Particularly, clock signal (201) is input to a voltage-controlled delay line (210) and to a phase detector (202) of the DLL (200). The phase detector (202) measures whether a phase difference between the clock signal (201) and an output signal, clk_out (217), of the voltage-controlled delay line (210) has the desired amount of delay. Depending on the phase difference, the phase detector (202) produces signals that control a charge pump (204). The phase detector (202) uses an up signal (203) and down signal (205) to adjust the charge pump (204) to increase or decrease its output current. To ensure that the charge pump (204) maintains some nominal current output, the charge pump (204) is internally biased. The internal biasing of the charge pump (204) is dependent on bias signals, $V_{BP}$ (209) and $V_{BN}$ (211), generated from a bias generator (208) (discussed below). The up and down signals (203, 205) adjust the current output of the charge pump (204) with respect to the nominal current set by the bias signals (209, 211).

The charge pump (204) adds or removes charge from a capacitor $C_1$ (206), which, in turn, changes a voltage potential at the input of the bias-generator (208). The capacitor (206) is connected between a power supply, $V_{DD}$, and a control signal, $V_{CTRL}$ (207). The bias-generator (208) produces the bias signals (209, 211) in response to the control signal (207), which, in turn, controls the delay of the voltage-controlled delay line (210) and, as mentioned above, maintains a nominal current output from the charge pump (204).

In FIG. 2, the voltage-controlled delay line (210) may be implemented using current starved elements. In other words, the delays of the voltage-controlled delay line (210) may be controlled by modifying the amount of current available for charging and discharging capacitances within the voltage-controlled delay line (210). The linearity of a voltage controlled delay line's characteristics determines the stable range of frequencies over which the DLL (200) can operate. The output signal (217) of the voltage-controlled delay line (210) represents a phase delayed copy of clock signal (201) that is then used by other circuits.

Still referring to FIG. 2, the negative feedback created by the output signal (217) in the DLL (200) adjusts the delay through the voltage-controlled delay line (210). The phase detector (202) integrates the phase error that results between the clock signal (201) and the output signal (217). The voltage-controlled delay line (210) delays the output signal (217) by a fixed amount of time such that a desired delay between the clock signal (201) and the output signal (217) is maintained.

Accordingly, proper operation of the receiver circuit (34 in FIG. 1) depends on the DLL (200) maintaining a constant phase delay between the clock signal (201) and the output signal (217).

SUMMARY OF INVENTION

According to one aspect of the present invention, an integrated circuit including a clock path arranged to carry a clock signal; a power supply path arranged to receive power from a power supply; a delay locked loop operatively connected to the power supply path and the clock path where the delay locked loop comprises a capacitor arranged to store a voltage potential dependent on a phase difference between the clock signal and a delayed clock signal output of the delay locked loop; a leakage current offset circuit operatively connected to the capacitor where the leakage current offset circuit is arranged to adjust the voltage potential; an adjustment circuit operatively connected to the leakage current offset circuit where the adjustment circuit is arranged to control the leakage current offset circuit; and a test processor unit operatively connected to the adjustment circuit where the test processor unit is arranged to selectively adjust the adjustment circuit.

According to one aspect of the present invention, a method for post-fabrication treatment of a delay locked loop including generating a delayed clock signal; comparing the delayed clock signal to an input clock signal; storing a voltage potential on a capacitor dependent on the comparing; generating a binary control word using a test processor unit; selectively adjusting an adjustment circuit responsive to the binary control word; and compensating a leakage current of the capacitor dependent on the selectively adjusting.

According to one aspect of the present invention, an integrated circuit including means for generating a delayed clock signal; means for comparing the delayed clock signal to an input clock signal; means for storing a voltage potential dependent on the means for comparing; means for generating a binary control word; and means for adjusting the voltage potential dependent on the binary control word.

DETAILED DESCRIPTION

Figure 1:
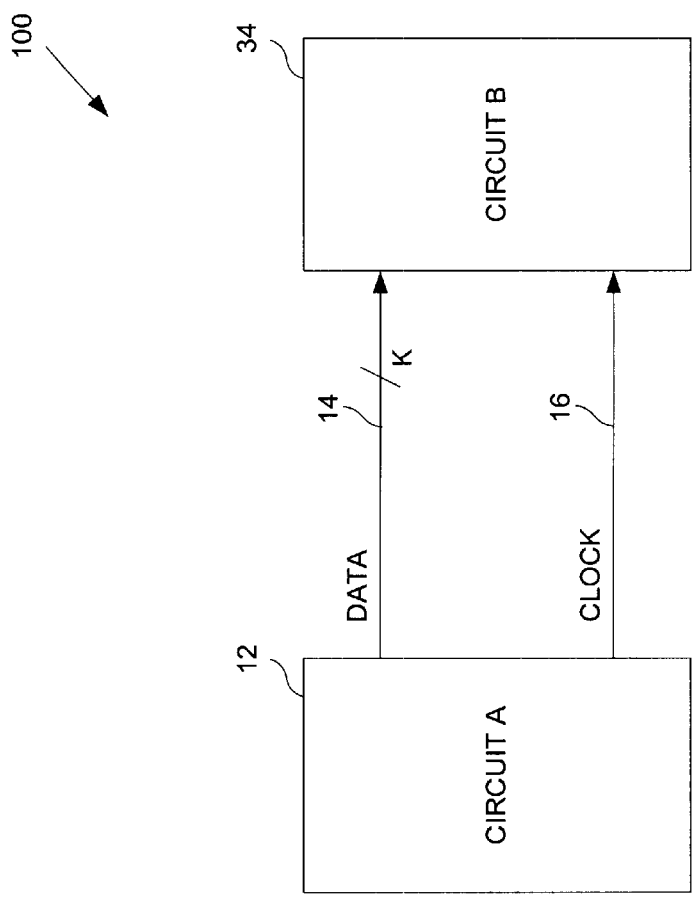
FIG. 1 shows a typical computer system component.

Exemplary embodiments of the invention will be described with reference to the accompanying drawings. Like items in the drawings are shown with the same reference numbers.

Figure 2:
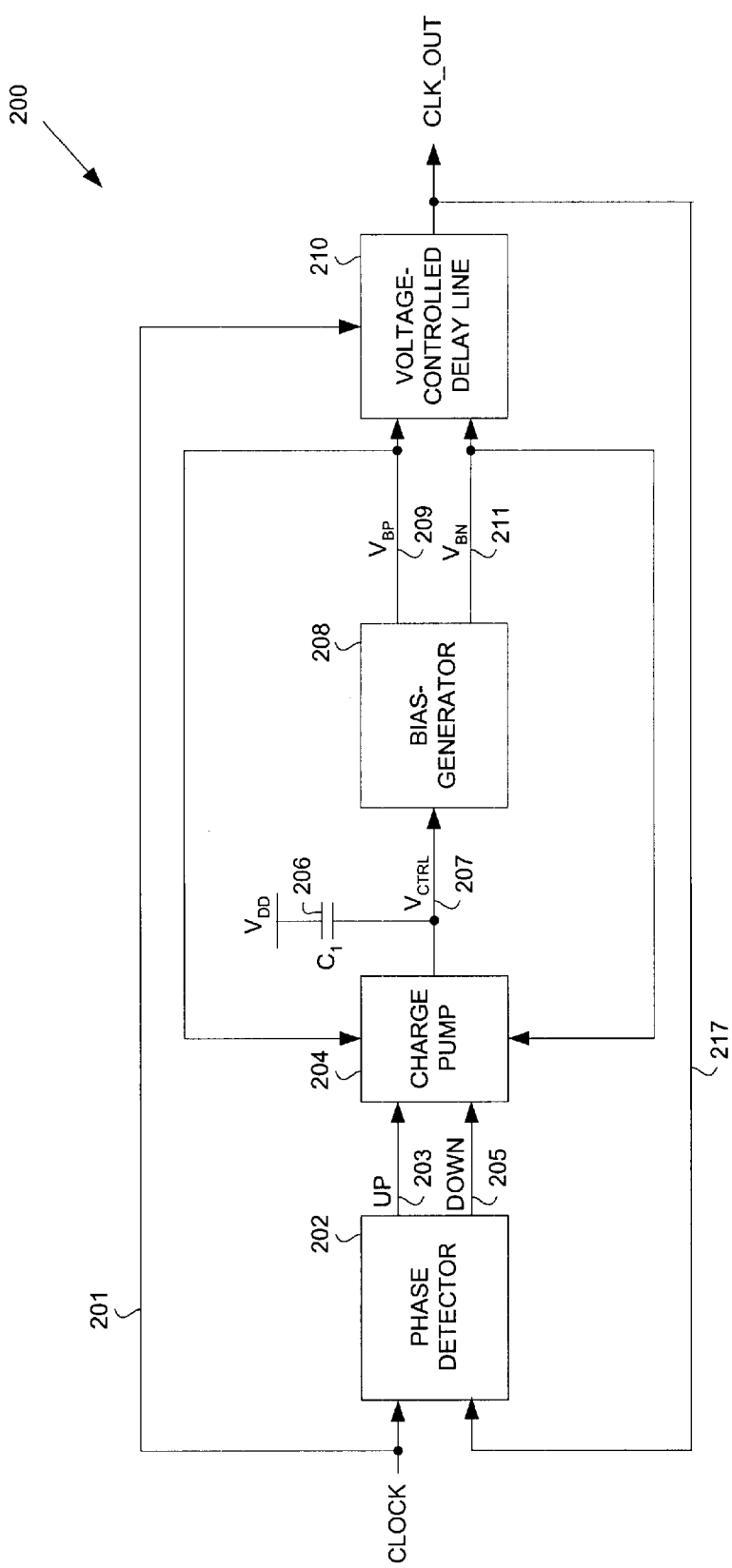
FIG. 2 shows a block diagram of a prior art delay locked loop.

The present invention relates to an adjustment system for post-fabrication adjustment of a DLL (200 shown in FIG. 2). In FIG. 2, the DLL (200) determines the amount of delay of the voltage-controlled delay line (210) dependent on a voltage potential maintained by the capacitor (206). Charge may leak from the capacitor (206) due leakage current, which, in turn, changes the stored voltage potential on the capacitor (206). Accordingly, the delay of the voltage-controlled delay line (210) may drift. The adjustment system includes an adjustment circuit that can compensate for the leakage current. Thus, the leakage current of the capacitor (206) may be offset such that the capacitor (206) maintains a constant voltage potential. Embodiments of the present invention relate to a method for modifying an operating characteristic of a delay locked loop after the delay locked loop has been manufactured.

Figure 3:
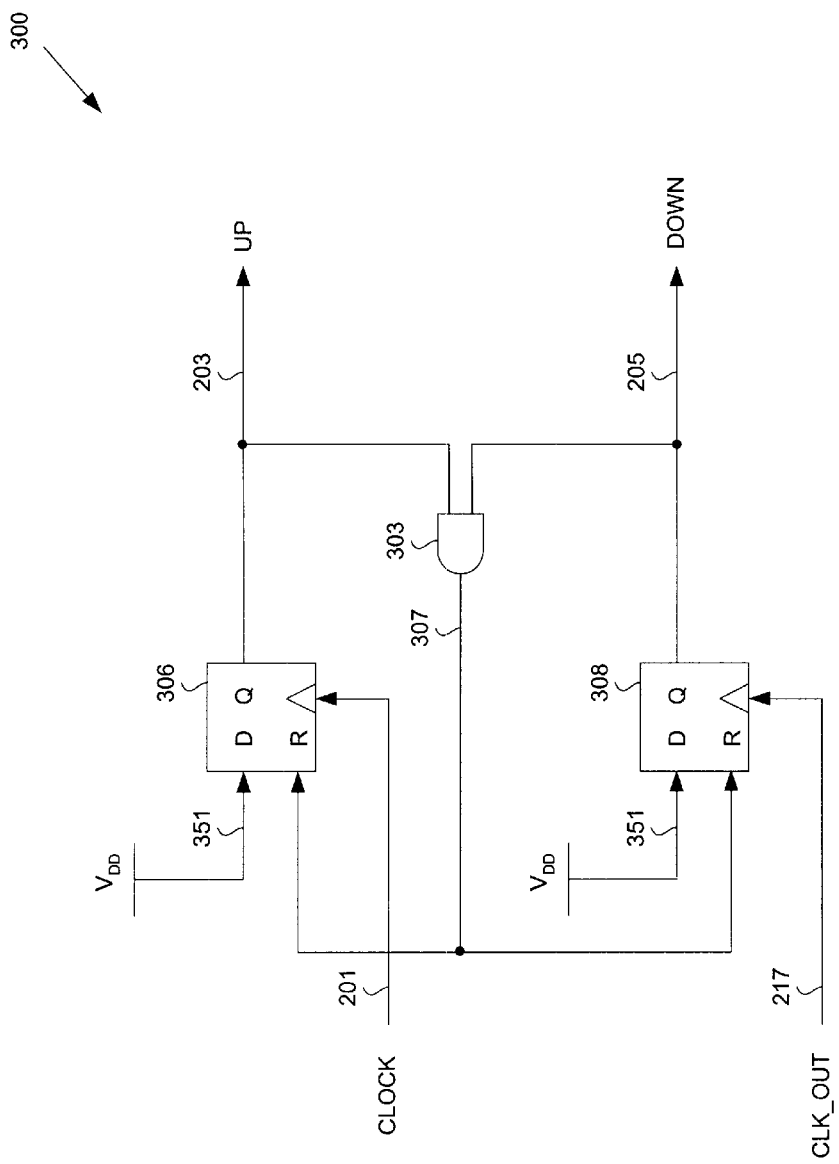
FIG. 3 shows a schematic diagram of a prior art phase detector.

FIG. 3 shows a block diagram of a typical phase detector (300). The phase detector (300) is representative of the generic phase detector (202) shown in FIG. 2. The phase detector (300) integrates the phase error that results between the clock signal (201) and the output signal (217). The clock signal (201) clocks a flip-flop (306) and the output signal (217) clocks a flip-flop (308).

When clock signal (201) transitions from a low state to a high state, the flip-flop (306) transfers the high state created by the power supply $V_{DD}$ (351) at an input of the flip-flop (306) to the up signal (203). When the output signal (217) transitions from a low state to a high state, flip-flop (308) transfers the high state created by the power supply $V_{DD}$ (351) at an input of the flip-flop (308) to the down signal (205). When both the up and down signals (203, 205) are at a high state, the AND gate (303) outputs a high state on signal line (307). The high state on signal line (307) resets both flip-flop (306) and flip-flop (308). The up and down signals (203, 205) transition to a low state when the flip-flop (306) and flip-flop (308) are reset, respectively.

Figure 4:
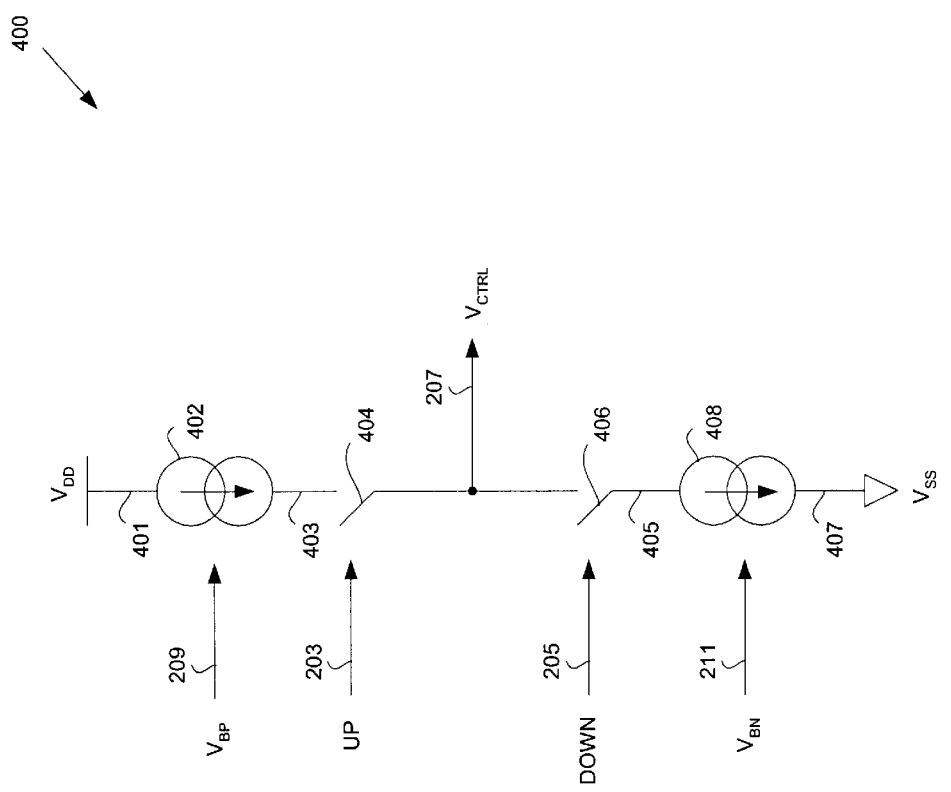
FIG. 4 shows a schematic diagram of a prior art charge pump.

FIG. 4 shows a block diagram of a typical charge pump (400). The charge pump (400) is representative of the generic charge pump (204) shown in FIG. 2. The charge pump (400) has two current sources (402, 408). The current source (402) provides a current based on the bias signal (209) (also shown in FIG. 2). The current source (408) provides a current based on the bias signal (211) (also shown in FIG. 2). The current source (402) is connected between the power supply $V_{DD}$ (401) and a signal line (403). The current source (408) is connected between the power supply $V_{SS}$ (407) and a signal line (405).

In FIG. 4, the up and down signals (203, 205) from the phase detector (300 shown in FIG. 3) determine whether switches (404, 406) are closed, respectively. When the up signal (203) is at a high state, the switch (404) is closed. The switch (404) is connected between signal (403) and the control signal (207). When closed, the switch (404) allows the current generated by the current source (402) to add charge to the capacitor (206 shown in FIG. 2) using the control signal (207).

When the down signal (205) is at a high state, the switch (406) is closed. The switch (406) is connected between signal (405) and the control signal (207). When closed, the switch (406) allows the current generated by the current source (408) to remove charge from the capacitor (206 shown in FIG. 2) using the control signal (207).

A short time period exists when both the up and down signals (203, 205) are at a high state. In FIG. 3, when both the up and down signals (203, 205) transition to a high state, the AND gate (303) resets the flip-flops (306, 308) by generating a high state on the signal line (307). A finite time duration is needed for the AND gate (303) and the flip-flops (306, 308) to respond to this change in state. In FIG. 4, both the switches (404, 406) are closed when both the up and down signals (203, 205) signals are high. During this time, a nominal amount of charge is added to the capacitor (206 shown in FIG. 2). In this case, some or all of the current generated by the current source (402) is transferred to the $V_{SS}$ power supply (407) through the current source (408).

Figure 5:
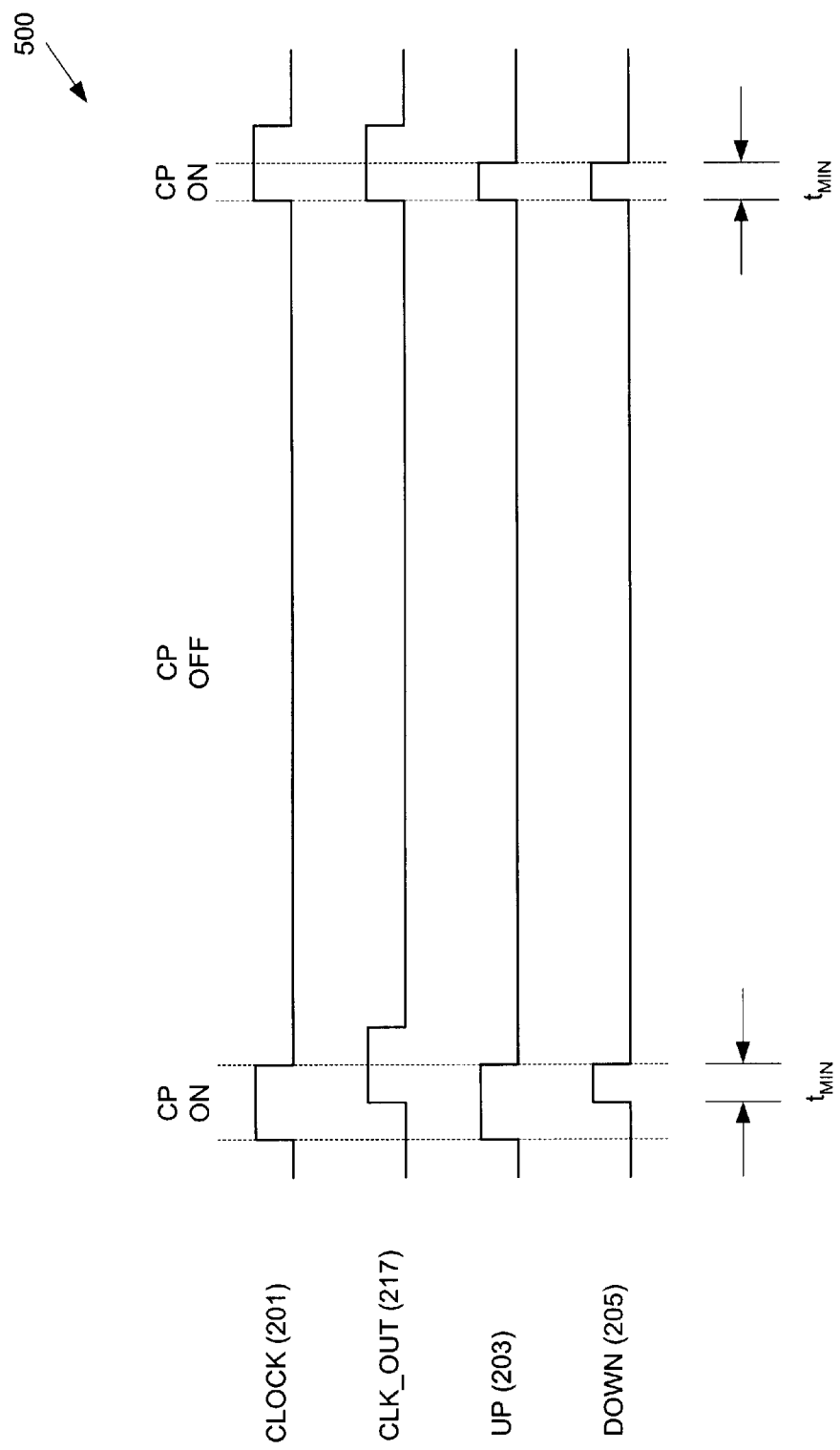
FIG. 5 shows a timing diagram for the phase detector shown in FIG. 3.

FIG. 5 shows a timing diagram (500) for the phase detector (300) shown in FIG. 3. The timing diagram (500) shows two clock cycles. The first clock cycle shows the output signal (217) lagging the clock signal (201) (i.e., they are out of phase). The second cycle shows the output signal (217) properly aligned with the clock signal (201).

In the first cycle, when the clock signal (201) transitions from a low state to a high state, the up signal (203) transitions from a low state to a high state. When the output signal (217) transitions from a low state to a high state, the down signal (205) transitions from a low state to a high state. Because both the up and down signals (203, 205) are at a high state, the AND gate (303 shown in FIG. 3) resets both flip-flops (306, 308 shown in FIG. 3). The up and down signals (203, 205) output a low state when the flip-flops (306, 308 shown in FIG. 3) are reset, respectively.

In the first cycle, the up signal (203) is at a high state for a longer duration than the down signal (205). Accordingly, the current source (402 shown in FIG. 4) adds charge to the capacitor (206 shown in FIG. 2). If the down signal (205) was at a high state for a longer duration than the up signal (203), the current source (408 shown in FIG. 4) would remove charge from the capacitor (206 shown in FIG. 2). The change in the voltage potential maintained by the capacitor (206 shown in FIG. 2) affects the delay of the voltage-controlled delay line (210 shown in FIG. 2).

In FIG. 5, in the second cycle, both the clock signal (201) and the output signal (217) transition from a low state to a high state at the same time. In other words, the clock signal (201) and the output signal (217) are in phase, and the DLL is said to be in "lock." Accordingly, both the up and down signals (203, 205) transition from a low state to a high state at the same time. Also, both the flip-flops (306 and 308 shown in FIG. 3) are reset simultaneously. Because a finite time duration (i.e., $t_{MIN}$) is needed for the AND gate (303 shown in FIG. 3) and the flip-flops (306 and 308 shown in FIG. 3) to respond to the change in state, both the up and down signals (203, 205) have a finite time duration for which they are high. During the time both the up and down signals (203, 205) are low, the voltage potential on the control signal, $V_{CTRL}$ (207), may have drifted toward the power supply, $V_{DD}$, due to the leakage current through the capacitor (206). A nominal amount of charge is added to the capacitor (206 shown in FIG. 2) to maintain the present voltage potential on the control signal (207 shown in FIG. 2).

In FIG. 5, the times during which the charge pump (400 shown in FIG. 4) may modify or maintain the charge on the capacitor (206 shown in FIG. 2) are indicated. When the clock signal (201) and the output signal (217) are aligned, the time duration that the charge pump (400 shown in FIG. 4) is active is relatively small (i.e., $t_{MIN}$).

During the time the charge pump (400 shown in FIG. 4) is inactive (i.e., when both switches (404, 406) are open), the voltage potential on the capacitor (206 shown in FIG. 2) may drift due to leakage currents inherent with devices used to form the capacitor (206 shown in FIG. 2). Semiconductor capacitors are typically parallel plate capacitors formed by connecting the source and drain of a transistor together to create one terminal of the capacitor. The other terminal of the capacitor is formed by the gate connection of the transistor. Tunneling through the gate creates a path for leakage current. Leakage current causes the voltage potential originally stored on the capacitor to change. In a DLL, the capacitor (e.g., 206 shown in FIG. 2) helps maintain the amount of delay produced by the voltage-controlled delay line (210 shown in FIG. 2).

In FIG. 2, the relatively long time durations between the charge pump (204) updating the charge stored (i.e., voltage potential stored) on the capacitor (206) may result in a drift in the expected amount of delay of the DLL (200). Although a designer may intend for an integrated circuit to have a particular value for the leakage current of the capacitor (206), actual values for these parameters are typically unknown until the integrated circuit has been fabricated (i.e., in a post-fabrication stage).

For example, a designer may intend for the delay drift of the DLL (200) to be within in a particular range. The leakage current of the capacitor (206) may be unintentionally affected by many factors in the fabrication process. Because the leakage current cannot be redesigned in the post-fabrication stage without considerable temporal and monetary expenditures, these fabrication factors may cause the DLL (200) to have a different delay drift range than the range it was designed to have and, therefore, the DLL (200) may have poor performance. Accordingly, there is a need for a technique and design that facilitates increased post-fabrication control of leakage current in the capacitor (206) of the DLL (200).

Figure 6:
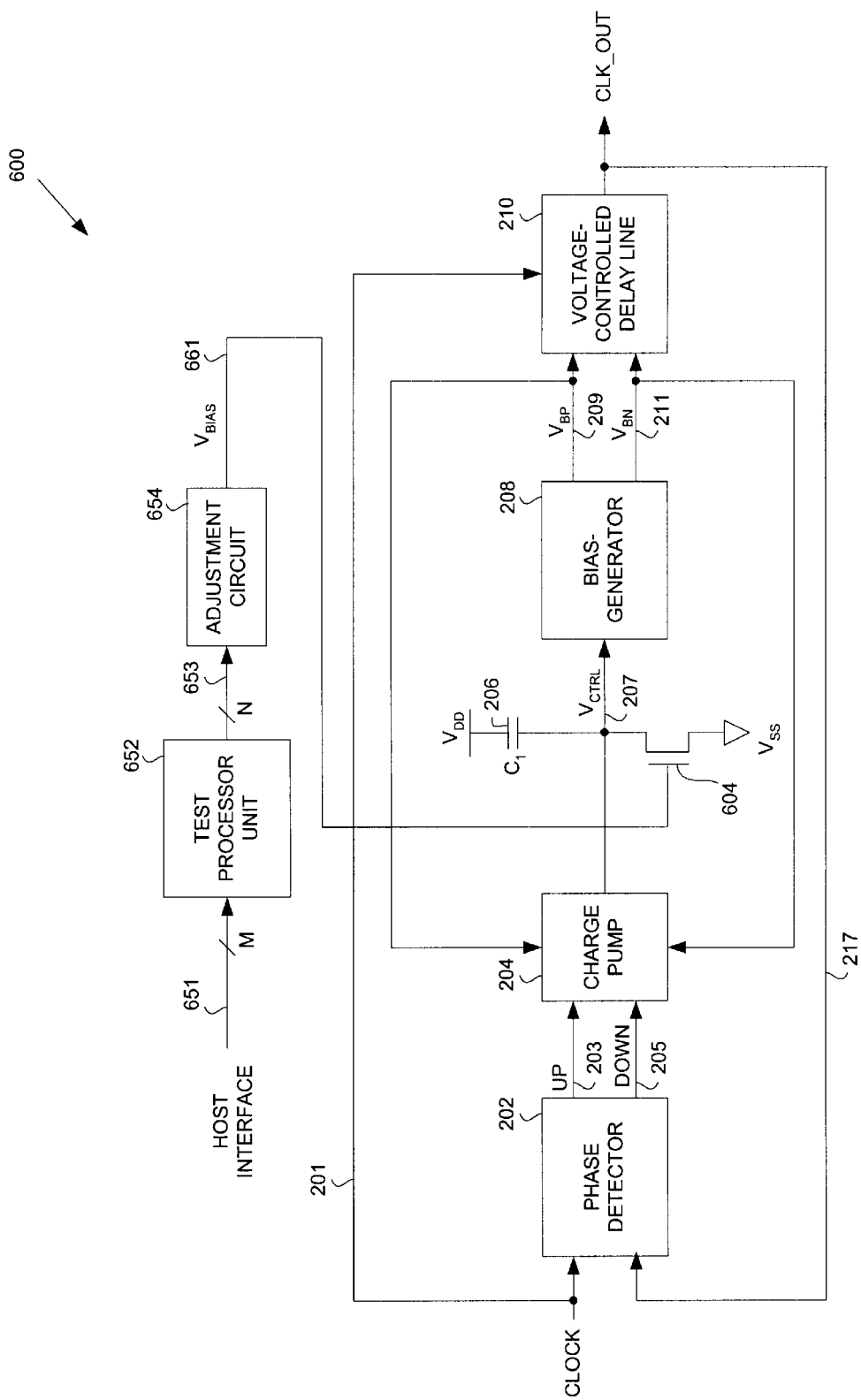
FIG. 6 shows a block diagram of a delay locked loop with an adjustable leakage current offset circuit in accordance with an embodiment of the present invention.

FIG. 6 shows an exemplary adjustable DLL (600) in accordance with an embodiment of the present invention. The phase detector (202), capacitor (206), bias-generator (208) and voltage-controlled delay line (210) of the adjustable DLL (600) operate similar to those respective components described above with reference to FIG. 2.

In FIG. 6, a leakage current offset circuit (604) is connected between the control signal (207) and a power supply $V_{SS}$. As the capacitor (206) leaks current, voltage potential on the control signal (207) has a tendency to drift toward the power supply $V_{DD}$. The leakage current offset circuit (604) is arranged to pull the voltage potential on the control signal (207) toward a power supply $V_{SS}$. For example, in FIG. 6, an n-channel transistor is used as the leakage current offset circuit (604).

One of ordinary skill in the art will appreciate that in other embodiments, the capacitor (206) may be connected between the control signal (207) and the power supply $V_{SS}$. In this case, the leakage current offset circuit (604) is connected between the control signal (207) and the power supply $V_{DD}$. A leakage current offset circuit (604) in this arrangement may be a p-channel transistor.

In FIG. 6, an adjustment circuit (654) is used to adjust the leakage current offset circuit (604) to compensate for the leakage current of the capacitor (206). A bias voltage potential, $V_{BIAS}$ (661), is used to control the amount of compensation applied to offset the leakage current. The bias voltage potential (661) may be adjusted to increase, decrease, turn off, or maintain the amount of leakage current compensation (i.e., leakage current offset) produced by the leakage current offset circuit (604).

In FIG. 6, a test processor unit (652) controls the adjustment circuit (654) using multiple adjustment signals N (653). The values of the multiple adjustment signals N (653) are determined by the test processor unit (652). The test processor unit (652) generates the multiple adjustment signals N (653), or binary control word, from registers that determine the settings of the adjustment circuit (654). The test processor unit (652) may change the contents of its registers through a host interface.

In an embodiment of the present invention, the test processor unit (652) may respond to instructions. The instructions may be interpreted by the test processor unit (652) and may result in a change to register contents stored in the test processor unit (652). A change to register contents may result in a change to the multiple adjustment signals N (653).

The test processor unit (652) may communicate through a host interface using M communication lines (651). Those of ordinary skill in the art will understand that the host interface and M communication lines (651) may take a wide variety of forms. In one or more embodiments, the host interface may be operatively connected to a separate computer system. Further in one or more embodiments, the host interface may be defined by an industry standard.

As mentioned above, the host interface may be used to operatively connect to a separate computer system. For example, a tester (not shown) may communicate with the test processor unit (652). In some embodiments, the tester (not shown) may instruct the test processor unit (652) to adjust adjustment circuit (654) to modify the offset of a leakage current of the adjustable DLL (600). In some embodiments, the tester (not shown) may measure an operating characteristic of the adjustable DLL (600) or a representative operating characteristic of an integrated circuit on which the adjustable DLL (600) resides to determine the effect of the adjustment. A variety of different adjustments may be made in order to identify the adjustment settings that produce the desired operating characteristics of the adjustable DLL (600).

For example, the tester (not shown) may be used to adjust the adjustable DLL (600) until the delay drift in the voltage-controlled delay line (210) is minimized. The tester (not shown) may also be used to adjust the adjustable DLL (600) until the operating characteristics of the adjustable DLL (600) reaches a desired performance level. Such operating characteristics may include delay drift, maximum operating frequency, minimum operating frequency, lock time, etc.

One of ordinary skill in the art will understand that even though the adjustment circuit (654) may be connected to the bias voltage potential (661) of the leakage current offset circuit (604), the adjustment circuit (654) may be turned "off." In other words, the adjustment circuit (654) may be controlled so as not to have an effect on the adjustable DLL (600).

Those skilled in the art will appreciate that the adjustable DLL (600) may be analog, digital, or a combination of both types of circuits.

Figure 7:
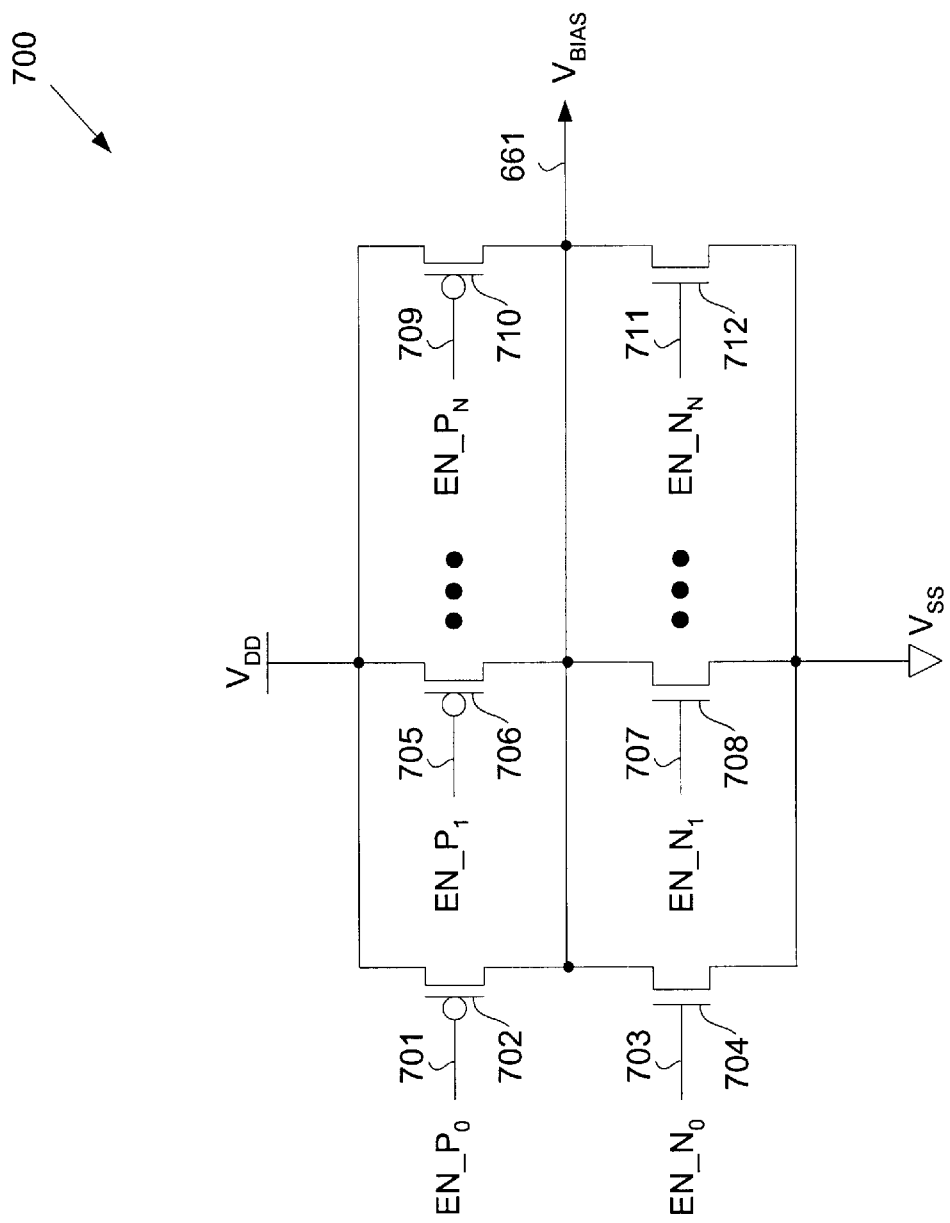
FIG. 7 shows a schematic diagram of an adjustment circuit in accordance with an embodiment of the present invention.

FIG. 7 shows an exemplary adjustment circuit (700) in accordance with an embodiment of the present invention. The adjustment circuit (700) includes multiple p-channel transistors (702, 706, 710) arranged in parallel with each other. The multiple p-channel transistors (702, 706, 710) connect between a power supply $V_{DD}$ and a common node on which a bias voltage potential (661) is supplied to the leakage current offset circuit (604 shown in FIG. 6). The adjustment circuit (700) also includes multiple n-channel transistors (704, 708, 712) arranged in parallel with each other. The multiple n-channel transistors (704, 708, 712) connect between power supply $V_{SS}$ and the bias voltage potential (661).

Each transistor has an individual control signal that turns "on" or "off" the respective p-channel transistors (702, 706, 710) and respective n-channel transistors (704, 708, 712). The p-channel transistors (702, 706, 710) have control signals EN_$P_0$ (701), EN_$P_1$ (705), and EN_$P_N$ (709) connected to their gates, respectively. The n-channel transistors (704, 708, 712) have control signals EN_$N_0$ (703), EN_$N_1$ (707), and EN_$N_N$ (711) connected to their gates, respectively. A "low" voltage potential on any of the EN_$P_X$ control signals (701, 705, 709), where "x" represents any index 0 through N, turns "on" the respective p-channel transistor (702, 706, 710). A "high" voltage potential on any of the EN_$N_X$ control signals (703, 707, 711), where "x" represents any index 0 through N, turns "on" the respective n-channel transistor (704, 708, 712).

A p-channel transistor (702, 706, 710) that is "on" changes the bias voltage potential (661) toward power supply $V_{DD}$. An n-channel transistor (704, 708, 712) that is "on" changes the bias voltage potential (661) toward power supply $V_{SS}$. By selecting which p-channel transistors (702, 706, 710) and/or n-channel transistors (704, 708, 712) are "on," a selected change in the bias voltage potential (661) may be achieved.

Those of ordinary skill in the art will understand that the p-channel transistors (702, 706, 710) and n-channel transistors (704, 708, 712) may be turned "on" individually or as a group. The p-channel transistors (702, 706, 710) and n-channel transistors (704, 708, 712) may be selected so that each transistor has a different effect compared to the other transistors. For example, a transistor's gate width may be varied to adjust the strength of each transistor. The gate widths of the p-channel transistors (702, 706, 710) and n-channel transistors (704, 708, 712) may be designed to provide a linear, exponential, or other function as more transistors are turned "on." In some embodiments, the p-channel transistors (702, 706, 710) and n-channel transistors (704, 708, 712) may be sized so that each transistor has a different resistance. For example, transistor gate lengths may be increased (i.e., long channel transistors) to increase the inherent resistance of each transistor. A larger inherent resistance may be advantageous if both a p-channel transistor and a n-channel transistor are "on" simultaneously. In one or more embodiments, the adjustment circuit (700) may include only one p-channel transistor (e.g., p-channel transistor (702)) and one n-channel transistor (e.g., n-channel transistor (704)) connected in series.

The adjustment circuit (700) in FIG. 7 may be used as the adjustment circuit (654) shown in FIG. 6. In FIG. 6, the test processor unit (652) generates a binary control word that determines which n-channel transistors (704, 708, 712 shown in FIG. 7) and p-channel transistors (702, 706, 710 shown in FIG. 7) are "on" and which are "off" in the adjustment circuit (654). Depending on the binary control word maintained by the test processor unit (652), multiple adjustment signals N (653) that represent EN_$N_X$ signals (703, 707, 711 in FIG. 7) and EN_$P_X$ signals (701, 705, 709 in FIG. 7) may turn "on" or turn "off" the p-channel transistors (702, 706, 710 shown in FIG. 7) and n-channel transistors 704, 708, 712 shown in FIG. 7) in the adjustment circuit (654). The bias voltage potential (661) of the adjustment circuit (654) adjusts the leakage current offset circuit (604).

Advantages of the present invention may include one or more of the following. In one or more embodiments, because the adjustment circuit (654 shown in FIG. 6) may modify the operating characteristics of the adjustable DLL (600 in FIG. 6), an investigation of the adjustable DLL's (600 in FIG. 6) response during operating conditions may be performed. Realistic results help determine appropriate values for circuit elements within the adjustable DLL (600 in FIG. 6) and help alleviate costly over design.

In one or more embodiments, because the adjustable DLL (600 in FIG. 6) may be fabricated with a means for adjusting the leakage current offset, fewer design iterations and higher confidence in the adjustable DLL (600 in FIG. 6) operating characteristics may be afforded.

In one or more embodiments, a tester (not shown) and test processor unit (652 shown in FIG. 6) may communicate so that performance characteristics may be analyzed, and/or adjustments made to the adjustable DLL (600 shown in FIG. 6).

In one or more embodiments, a limited number of adjustable DLLs (600 in FIG. 6) may need to be tested to determine the desired value for the binary word or a larger number of adjustable DLLs (600 in FIG. 6).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a clock path arranged to carry a clock signal;
   a power supply path arranged to receive power from a power supply;
   a delay locked loop operatively connected to the power supply path and the clock path, wherein the delay locked loop comprises a capacitor arranged to store a voltage potential dependent on a phase difference between the clock signal and a delayed clock signal output of the delay locked loop;

a leakage current offset circuit operatively connected to the capacitor, wherein the leakage current offset circuit is arranged to adjust the voltage potential;

an adjustment circuit operatively connected to the leakage current offset circuit, wherein the adjustment circuit is arranged to control the leakage current offset circuit; and a test processor unit operatively connected to the adjustment circuit, wherein the test processor unit is arranged to selectively adjust the adjustment circuit.

2. The integrated circuit of claim 1, wherein the adjustment circuit comprises:

a first switch arranged to control current flow between a first voltage potential and an output of the adjustment circuit; and a second switch arranged to control current flow between a second voltage potential and the output of the adjustment circuit, wherein the output is operatively connected to the leakage current offset circuit.

3. The integrated circuit of claim 1, wherein the adjustment circuit comprises a first p-channel transistor and a first n-channel transistor, wherein the first p-channel transistor and the first n-channel transistor are connected in series.

4. The integrated circuit of claim 3, the adjustment circuit further comprising:

a second p-channel transistor connected in parallel with the first p-channel transistor; and a second n-channel transistor connected in parallel with the first n-channel transistor, wherein the first p-channel transistor and second p-channel transistor are in series with the first n-channel transistor and second n-channel transistor.

5. The integrated circuit of claim 4, wherein the first p-channel transistor is a longer channel transistor than the second p-channel transistor.

6. The integrated circuit of claim 4, wherein the first n-channel transistor is a longer channel transistor than the second n-channel transistor.

7. The integrated circuit of claim 4, wherein the first p-channel transistor is a wider gate width transistor than the second p-channel transistor.

8. The integrated circuit of claim 4, wherein the first n-channel transistor is a wider gate width transistor than the second n-channel transistor.

9. The integrated circuit of claim 1, wherein the leakage current offset circuit comprises a transistor, and wherein the adjustment circuit is operatively connected to a gate of the transistor.

10. The integrated circuit of claim 1, wherein the test processor unit is arranged to respond to an instruction.

11. The integrated circuit claim 1, wherein the test processor unit generates a binary control word.

12. The integrated circuit of claim 11, wherein the adjustment circuit is responsive to the binary control word.

13. A method for post-fabrication treatment of a delay locked loop, comprising:

generating a delayed clock signal;

comparing the delayed clock signal to an input clock signal;

storing a voltage potential on a capacitor dependent on the comparing;

generating a binary control word using a test processor unit;

selectively adjusting an adjustment circuit responsive to the binary control word; and compensating a leakage current of the capacitor dependent on the selectively adjusting.

14. The method of claim 13, wherein compensating uses a leakage current offset circuit.

15. The method of claim 14, wherein the selectively adjusting uses the adjustment circuit to operatively control a gate of a transistor in the leakage current offset circuit.

16. The method of claim 13, wherein the selectively adjusting the adjustment circuit comprises:

controlling a first current flow between a first voltage potential and an output of the adjustment circuit; and controlling a second current flow between a second voltage potential and the output of the adjustment circuit.

17. The method of claim 13, wherein the adjustment circuit comprises a first p-channel transistor and a first n-channel transistor connected in series.

18. The method of claim 17, the adjustment circuit further comprising:

a second p-channel transistor connected in parallel with the first p-channel transistor; and a second n-channel transistor connected in parallel with the first n-channel transistor, wherein the first p-channel transistor and second p-channel transistor are in series with the first n-channel transistor and second n-channel transistor.

19. The method of claim 18, wherein the first p-channel transistor is a longer channel transistor than the second p-channel transistor.

20. The method of claim 18, wherein the first n-channel transistor is a longer channel transistor than the second n-channel transistor.

21. The method of claim 18, wherein the first p-channel transistor is a wider gate width transistor than the second p-channel transistor.

22. The method of claim 18, wherein the first n-channel transistor is a wider gate width transistor than the second n-channel transistor.

23. The method of claim 13, wherein the leakage current offset circuit comprises a transistor.

24. The method of claim 13, wherein the selectively adjusting comprises:

using the test processor unit to adjust the adjustment circuit to one of a fixed number of possible settings.

25. An integrated circuit, comprising:

means for generating a delayed clock signal;

means for comparing the delayed clock signal to an input clock signal;

means for storing a voltage potential dependent on the means for comparing;

means for generating a binary control word; and means for adjusting the voltage potential dependent on the binary control word.

* * * * *